United States Patent [19]
Battersby et al.

[11] Patent Number: 5,528,065
[45] Date of Patent: Jun. 18, 1996

[54] DUAL-GATE INSULATED GATE FIELD EFFECT DEVICE

[75] Inventors: Stephen J. Battersby, Haywards Heath, England; Louis Praamsma, Nijmegen, Netherlands

[73] Assignee: U.S. Philips Corporation, New York, N.Y.

[21] Appl. No.: 457,945

[22] Filed: Jun. 1, 1995

Related U.S. Application Data

[63] Continuation of Ser. No. 182,309, Jan. 18, 1994, abandoned, which is a continuation of Ser. No. 6,115, Jan. 15, 1993, abandoned.

[30] Foreign Application Priority Data

Jan. 17, 1992 [GB] United Kingdom .................. 9201004

[51] Int. Cl.$^6$ .................................................. H01L 29/60
[52] U.S. Cl. ........................ 257/365; 257/394; 257/382; 257/401
[58] Field of Search .................................. 257/368, 386, 257/369, 379, 382, 390, 365, 401

[56] References Cited

U.S. PATENT DOCUMENTS

| 4,635,088 | 1/1987 | Eguchi | 257/365 |
| 4,879,582 | 11/1989 | Kimura et al. | 257/368 |

FOREIGN PATENT DOCUMENTS

| 0076006 | 4/1983 | European Pat. Off. | |
| 0204336 | 10/1986 | European Pat. Off. | 257/394 |
| 0330142 | 8/1989 | European Pat. Off. | 257/365 |
| 0112234 | 4/1990 | Japan | 257/365 |
| 1175601 | 12/1969 | United Kingdom | |

OTHER PUBLICATIONS

Sze, S. M., Semi conductor Devices : Physics and Technology, Bell Telephone Laboratories, Inc., 1985, pp. 422–423 and 376–377.

"A UHF MOS Tetrode With Polysilicon Gate" Solid–State Electronics, vol. 23, pp. 23–30, by F. M. Klassen, H. J. Wilting and W. C. J. de Groot; Pergamon Press Ltd. 1980.

*Primary Examiner*—Robert P. Limank
*Assistant Examiner*—David B. Hardy
*Attorney, Agent, or Firm*—Steven R. Biren

[57] ABSTRACT

A dual-gate insulated gate field effect device (1) such as a MOS tetrode has an active device area (3) in which adjacent source regions (5) are separated by and spaced apart from an intervening drain region (6) to define a respective conduction channel region (7) between each source and drain region (5 and 6). An insulated gate structure (10) has first insulated gate sections (11) forming an inner insulated gate (110) connected so as to surround each drain region 6 and second insulated gate sections (12) provided between the first insulated gate sections (11) and the source regions (5) and forming an outer insulated gate (120). Ends (11a,12a) of the insulated gate sections (11 and 12) extend onto the surrounding field oxide (4) to connect with respective first and gate conductors (13 and 14). Each drain region (6) is associated with an additional source region (50) spaced apart from the drain region (6) in a direction parallel to the width W of the conduction channel regions to define an additional conduction channel region. The second insulated gate sections (12) are connected to provide an area of insulated gate (12b) between each additional source region (50) and the associated drain region (6). This substantially eliminates leakage currents and enables the use of a design in which parasitic capacitances are reduced.

8 Claims, 3 Drawing Sheets

DUAL-GATE INSULATED GATE FIELD EFFECT DEVICE

This is a continuation of application Ser. No. 08/182,309, filed Jan. 18, 1994, which is a continuation of Ser. No. 08/006,115, filed Jan. 15, 1993, all abandoned.

BACKGROUND OF THE INVENTION

Invention relates to a semiconductor device comprising a dual-gate insulated gate field effect device such as a MOS tetrode.

Such devices are particularly suitable for use as amplifier elements in high frequency pre-amplifiers of, for example, radio or television receivers in which a signal received by an antenna of the receiver is applied to one insulated gate of the insulated gate field effect device and the other insulated gate is connected to a voltage supply which can be adjusted to control the gain of the insulated gate field effect device so that the amplified signals have a substantially constant amplitude, regardless of the amplitude of the input signal.

In order to provide the insulated gate field effect device with the required high transconductance, the conduction channel of the device should be large in a direction transverse to the path of charge carriers through the conduction channel. Conventionally, this "transverse" direction is referred to as the channel width while the parallel direction is referred to as the channel length. In addition to a large width, a short conduction channel length is desired to give a high transconductance and low gate-source capacitance.

EP-A-76006 describes an example of such an insulated gate field effect device having a source region surrounding its drain region to define therebetween a conduction channel shaped so that the two insulated gates which overlie the conduction channel follow a meandering path with a first one of the insulated gates surrounding the drain region and the second one of the insulated gates surrounding the first insulated gate. As shown in EP-A-76006, a break or interruption is provided in the outer insulated gate in the vicinity of the connection between the inner insulated gate and its bond pad. The two ends of the outer insulated gate are extended and connected to a single bond pad. This arrangement allows the bond pads to be positioned on the surrounding insulating region well away from the active device area, so reducing parasitic capacitance effects.

The conductive layers of the insulated gates of the device described in EP-A-76006 are formed of aluminum. Aluminum is highly conductive and so the frequency response of the device is not unduly affected by the provision of the long narrow strips of aluminum required to provide the necessary wide yet short conduction channel regions. Typically, the width of the conduction channel region may be 750 to 1000 times its length.

The use of a self-aligned technology in which the source and drain regions are formed using the insulated gates as a mask is desirable because it enables shorter channel lengths and smaller gate to source/drain overlaps and thus smaller parasitic capacitances. However, aluminum is not suitable for use in a self-aligned technology because the aluminum conductive layers of the insulated gates cannot be subjected to the high temperature processes used to the form the source and drain regions.

Materials suitable for forming the conductive layers of insulated gates which can withstand such high temperature processing include doped polycrystalline silicon and refractory metal silicides such as titanium or cobalt silicide. The materials which can be used in a self-aligned technology have a much higher resistance than aluminum and so simply replacing the aluminum gate with a gate made of such a material would result in a device having a high gate resistance which may cause an unacceptably large attenuation of the input signal or a correspondingly high noise figure at high frequencies, resulting in a significant limitation in the frequency response of the device. Accordingly if a self-aligned technology is to be used, alternative geometries have to be adopted. A paper entitled "a UHF MOS Tetrode with polysilicon gate" by F. M. Klaassen et. al. published in Solid State Electronics Volume 23, 1980 at pages 23 to 30 describes a MOS tetrode in which an interdigitated comb-like structure is adopted for the insulated gates with each insulated gate being divided into a number of fingers (the teeth of the comb) which are connected, away from the active device area, by a high conductivity insulated gate conductor made of, for example, aluminum or an aluminium alloy. The overall gate width of each insulated gate is thus divided into a series of insulated gate sections or fingers connected in parallel by a highly conductive insulated gate conductor, so reducing the overall gate resistance.

Each insulated gate section of this structure has to extend beyond the active device area onto the surrounding insulating region both to enable connection to the respective one of the insulated gate conductors and to provide a well-defined edge to the insulated gate structure. In order to achieve a desirably low output capacitance, the semiconductor body should have a body region with a very low doping, typically $0.7 \times 10^{15}$ to $1 \times 10^{15}$ atom $cm^{-2}$, at least adjacent the one major surface. Thermal oxide such as gate oxide typically has $1 \times 10^{11}$ to $2 \times 10^{11}$ positive charges per $cm^2$ within about 5 nm of a silicon-silicon oxide interface and accordingly such a lowly doped body region can be expected to be inverted and so to form a conduction channel with as little as $10^9$ to $10^{11}$ electrons $cm^{-2}$ under insulating material thicker than 50 nm. Accordingly, there is a problem with leakage currents where the ends of the insulated gates extend onto the surrounding insulating region. This problem is considerably greater in a self-aligned technology device, which may have, for example, twenty insulated gate sections, than in an aluminum gate technology.

Special steps need to be taken to reduce leakage current at the ends of the insulated gates. One method of reducing this leakage current is to ensure that there is a distance of 2-3 micrometers (μm) of the lowly doped body region over which the ends of the insulated gate sections pass before extending onto the surrounding insulating region. Once allowance has been made for alignment tolerances there is about 6 μm at each end of each insulated gate section which can carry no current but which does add to the parasitic capacitance problem and which, for a self-aligned technology device with many parallel-connected insulated gate sections, can represent about a 20% (percent) increase in the gate capacitance.

SUMMARY OF THE INVENTION

It is an aim of the present invention to provide a semiconductor device comprising an insulated gate field effect device in which leakage currents can be reduced without adding significantly to the parasitic capacitance.

According to the present invention there is provided a semiconductor device comprising an insulated gate field effect device, the semiconductor device comprising a semiconductor body having adjacent one major surface an active device area bounded by an insulating region, the active device area comprising a plurality of source regions with adjacent source regions being separated by and spaced apart from an intervening drain region to define a respective conduction channel region between each source and drain region, and an insulated gate structure overlying each conduction channel region for providing a gateable connection between each source and drain region, the insulated gate structure comprising, for each conduction channel region, a first insulated gate section adjacent the drain region and a second insulated gate section between the first insulated gate section and the adjacent source region, the insulated gate sections having ends extending beyond the active device area onto the insulating region to enable the first and second insulated gate sections to be connected to respective first and second insulated gate conductors outside of the active device area, the first insulated gate sections being connected within the active device area so as to surround each drain region, each drain region being associated with an additional source region provided within the active device area spaced apart from the drain region in a direction parallel to the width of the conduction channel regions to define an additional conduction channel region between the drain region and the additional source region and the second insulated sections being connected so as to provide an area of insulated gate between each additional source region and the associated drain region.

In a device in accordance with the invention, the inner or first insulated gate surrounds each drain region while the outer or second insulated gate is closed at one end by an area of insulated gate which extends between the drain region and an additional source region. Closing the outer gate at one end reduces leakage currents from this end so that it is no longer necessary to provide an area of the lowly doped body region to minimize leakage currents between the active device area and the surrounding insulating region. This reduces the parasitic capacitances within the device. In addition the additional areas of insulated gate between the additional source regions and drain regions increase the total gate width so that the parasitic capacitance, as a fraction of the total, is reduced even further.

The first insulated gate sections may be connected to form a respective closed loop insulated gate region surrounding each drain region and having a common end extending beyond the active device area onto the insulating region for enabling connection to the first insulated gate conductor. Connecting the first insulated gate sections to form a closed loop provides a surface-potential defining ring which should reduce potential leakage paths.

Generally the insulated gate field effect device comprises an array of alternate source and drain regions provided within the active device area. Typically, there may be eight drain regions and nine source regions.

Normally, the active device area may comprise a relatively lowly doped body region of one conductivity type within which opposite conductivity type source and drain regions are provided.

The source regions and additional source region bounding each drain region may form a continuous source area which may result in a lower access resistance.

Adjacent first and second insulated gate sections may be spaced apart and a relatively highly doped region provided adjacent the one major surface in the space between the first and second insulated gate sections to enable a continuous conduction channel to be provided between each source and drain region.

The present invention allows the use of a self-aligned technology without a significant adverse increase in either leakage current or parasitic capacitance. The insulated gates may have a conductive gate layer comprising a metal silicide, for example titanium or cobalt silicide.

BRIEF DESCRIPTION OF THE DRAWING

Embodiments of the invention will now be described, by way of example, with reference to the accompanying drawing, in which.

Figure 1:
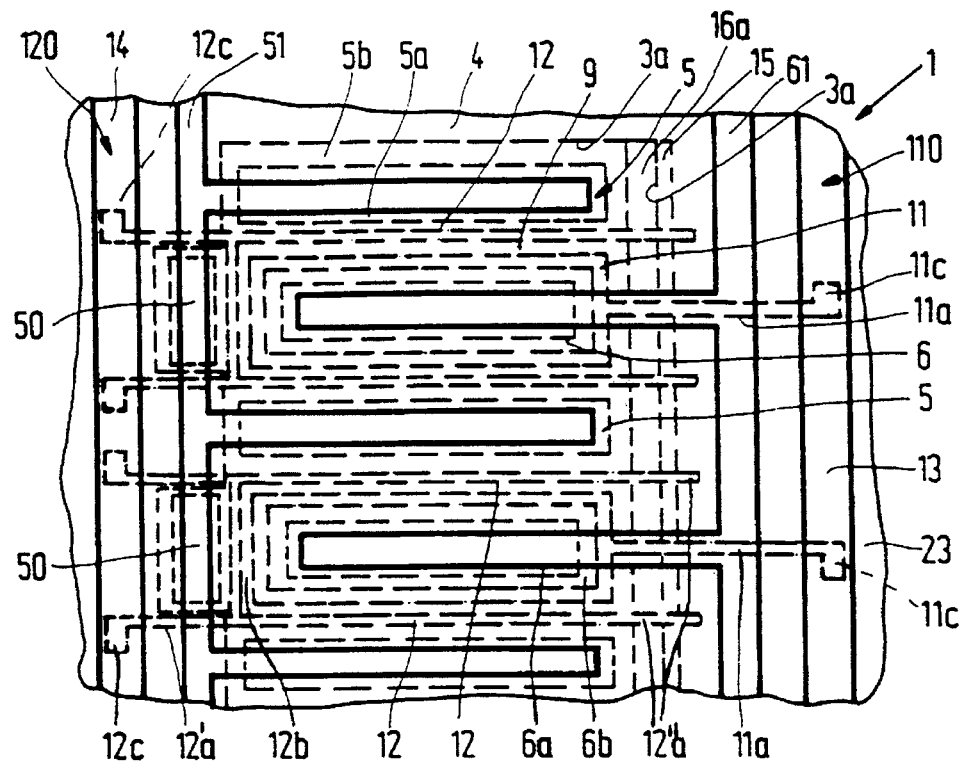
FIG. 1 is a schematic plan view of part of a semiconductor device in accordance with the invention.

It should be understood that the Figures are merely schematic and are not drawn to scale. In particular certain dimensions such as the thickness of layers or regions may have been exaggerated while other dimensions may have been reduced. Similar reference numerals are used throughout the Figures to indicate the same or similar parts.

DESCRIPTION OF THE PREFERRED EMBODIMENTS

Referring now to the drawings, for example FIGS. 1 to 5, there is illustrated a semiconductor device comprising an insulated gate field effect device 1, in particular a dual gate insulated gate field effect device such as a MOS tetrode suitable for use as an amplifier element in a high frequency preamplifier of, for example, a radio or television transmission receiver. The semiconductor device comprises a semiconductor body 2 (see especially FIGS. 3 to 5) having adjacent one major surface 2a an active device area 3 bounded by an insulating region 4.

The active device area 3 comprises a plurality of source regions 5 with adjacent source regions being separated by and spaced apart from an intervening drain region 6 to define a respective conduction channel region 7 between each source and drain region 5 and 6, and an insulated gate structure 10 overlying each conduction channel region 7 for providing a gateable connection between each source and drain region 5 and 6.

The insulated gate structure 10 comprises, for each conduction channel region 7, a first insulated gate section 11 adjacent the drain region 6 and a second insulated gate section 12 between the first insulated gate section 11 and the adjacent source region 5, the insulated gate sections 11 and 12 having ends 11a and 12a extending beyond the active device area 3 onto the insulating region 4 to enable the first and second insulated gate sections 11 and 12 to be connected to respective first and second insulated gate conductors 13 and 14 outside of the active device area and to form a well-defined edge to the insulated gate structure 10.

The first insulated gate sections 11 are connected within the active area 3 so as to surround each drain region 6. Each drain region 6 is associated with an additional source region 50 provided within the active area 3 spaced apart from the drain region 6 in a direction parallel to the width W of the conduction channel regions 7 to define an additional conduction channel region 70 between the drain region 6 and the additional source region 50 and the second insulated gate sections 12 are connected to provide an area of insulated gate 12b between each additional source region 50 and the associated drain region 6.

The inner or first insulated gate 110 formed by the first insulated gate sections 11 surrounds each drain region 6 while the outer or second insulated gate 120 formed by the second insulated gate sections 12 is closed at one end by an area of insulated gate 12b which extends between the drain region 6 and an additional source region 50. Closing the outer insulated gate 120 at one end should eliminate leakage currents from this end so that it is no longer necessary to provide an area of lowly doped body region adjacent the closed end of the outer insulated gate 120 to minimize leakage currents travelling between the different parts of the active device area 3 via semiconductor areas underneath the surrounding insulating region 4. This reduces the parasitic capacitances within the device. An area of lowly doped body region 16a should still be provided adjacent the open end of the outer insulated gate 120 so as to reduce leakage currents at that end. The additional areas 12b of insulated gate between the additional source regions 50 and drain regions 6 increase the total gate width so that the parasitic capacitance, as a fraction of the total, is reduced even further.

Referring now specifically to the examples illustrated in the Figures, FIGS. 1 to 5 illustrate part of an insulated gate field effect device consisting of an array of alternate source and drain regions 5 and 6 defining therebetween conduction channel regions 7 over which extends an insulated gate structure 10 providing first and second insulated gates 110 and 120 as will be described in detail below. A connecting island region 9 (FIGS. 3 to 5) of the same conductivity type as the source and drain regions 5 and 6 is provided between the insulated gates 110 and 120 to enable a continuous conductive path between a source and the adjacent drain region when appropriate control signals are applied to the insulated gates 110 and 120.

Each of the insulated gates 110 and 120 is formed of a number of insulated gate sections 11 and 12, respectively, having ends 11a and 12a which extend beyond the active device area 3 onto the surrounding insulating region 4, which is normally referred to as field oxide, where more highly conductive insulated gate conductors 13 and 14 connect the respective insulated gate sections in parallel. FIG. 1 is a schematic plan view which shows the insulated gate conductors 13 and 14 in solid lines and indicates the underlying regions in phantom lines thereby illustrating the connection between the ends 11a and of the insulated gate sections 11 and 12 and their respective conductors 13 and 14.

Figure 2:
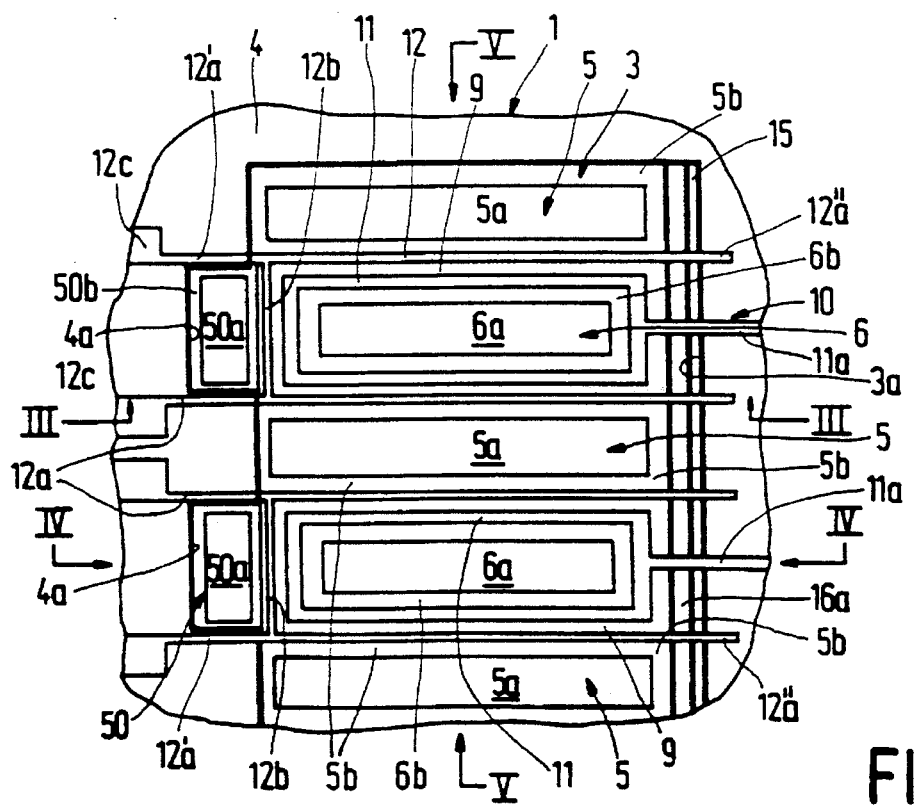
FIG. 2 is a schematic plan view similar to FIG. 1 but with the top metallization and underlying insulating layer omitted.

As shown most clearly in FIG. 2, the first insulated gate sections 11 are connected so as to define a closed loop insulated gate region surrounding each drain region 6 and having a common end 11a extending over the lowly doped body region 16a provided between the source and drain regions 5 and 6 and the edge 3a of the active device area 3 and beyond the active device area 3 onto the field oxide 4 to provide a contact area 11c (FIG. 1) for connection to the insulated gate conductor 13. This region 16a is shown most clearly in FIG. 3 which is a cross-sectional view taken looking in the direction of the arrow heads on the line III—III in FIG. 2, that is just to one side of and looking toward an insulated gate section 12. An additional source 50 is provided in a recess 4a in the field oxide 4 at the end of each drain region 6 remote from the ends 11a of the first insulated gate sections 11 so as to define an additional conduction channel 70 between each drain region 6 and the associated additional source region 50. The second insulated gate sections 12 have ends 12a extending beyond the active device area 3 onto the field oxide 4 at each end of the drain region 6. The two second insulated gate sections 12 associated with each drain region region 6 are connected together at the end of the drain region remote from the ends 11a of the first insulated gate sections so as to provide an area 12b of insulated gate overlying each additional conduction channel region 70. The ends 12'a of the second insulated gate sections 12 extend beyond the additional areas 12b onto the field oxide 4 to provide contact areas 12c for connection to the second insulated gate conductor 14. The other ends 12"a of the insulated gate sections 12 also extend up onto the field oxide 4 with the ends 11a. A well-defined edge is thus provided for the insulated gate structure 10.

The number of source and drain regions 5 and 6 and the number of insulated gate sections ends 11a, 12a will depend on the desired characteristics of the device. As indicated above it is desirable for the device to have a very wide short conduction channel (for example the width of the conduction channel region may be perhaps even as much as 2500 times its length), to provide a large current carrying capacity, but for the gate resistance not to be so high that it detrimentally affects the frequency response of the device. Where, as will be described below, the insulated gate sections 11 and 12 have conductive regions formed of a material such as a refractory metal silicide which enables the use of self-aligned technology and where, typically, the width of the active device area 3 (that is the dimension parallel to the width of the conduction channel) is somewhat under 60 μm, the array may consist of sixteen drain regions 6 with associated source and additional source regions 5 and 50 and sixteen ends 12a (but only eight common ends 11a). The closure of the outer or second insulated gate 120 by the additional insulated gate areas 12b not only inhibits leakage currents, without excessively increasing parasitic capacitances, but also provides an addition to the overall gate width and may, depending upon the particular geometry, represent an increase in the overall gate width of something in the region of 20 μm. As will be discussed below, at the ends of the drain regions 6 remote from the additional source regions 50, the insulated gate sections 11, 12 extend over a few μm (3–6 μm) of the underlying relatively lowly doped body portion 21 (see FIGS. 3 to 5) before extending up onto the field oxide 4. This serves to inhibit or at least reduce leakage currents.

The source and additional source regions 5 and 50 are connected, as shown in FIG. 1, by source metallization 51 which forms a comb-like structure and is interdigitated with similar comb-like structure metallization 61 connecting the drain regions 6.

It will of course be appreciated that FIGS. 1 and 2 in particular are extremely schematic and that in practice the various regions and layers will have round rather than sharp corners as shown in FIGS. 1 and 2. In addition, of course, other geometrical layout than the simple linear design of alternate source and drain regions 5 and 6 shown in FIGS. 1 and 2 may be possible.

Figure 3:
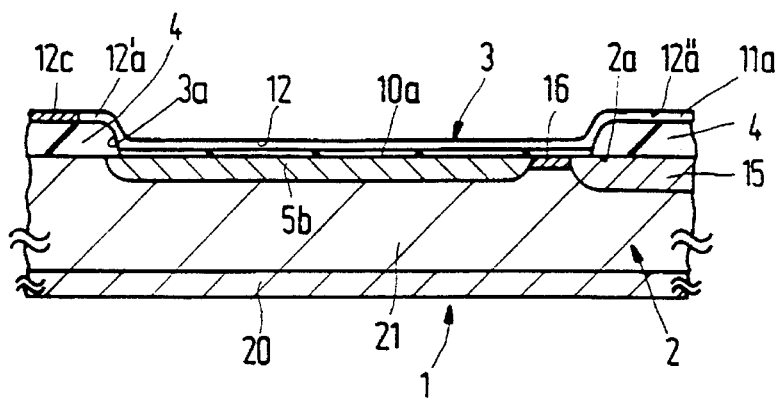
FIG. 3 is a cross-sectional view taken along the line III—III FIG. 2.
Figure 4:
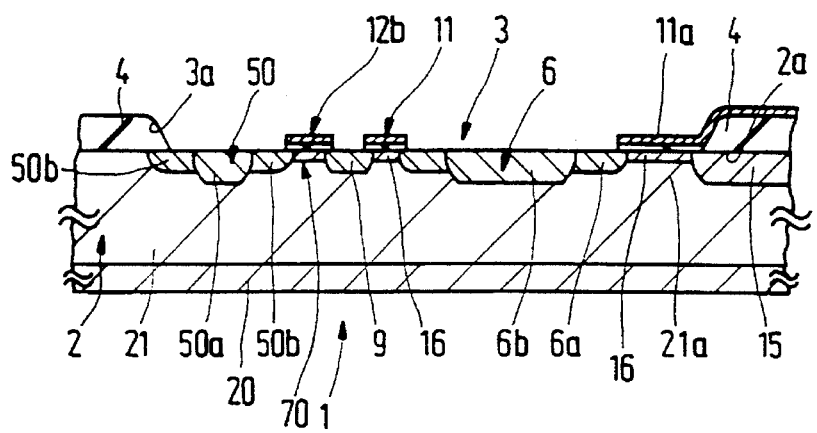
FIG. 4 is a cross-sectional view taken along the line IV—IV in FIG. 2.
Figure 5:
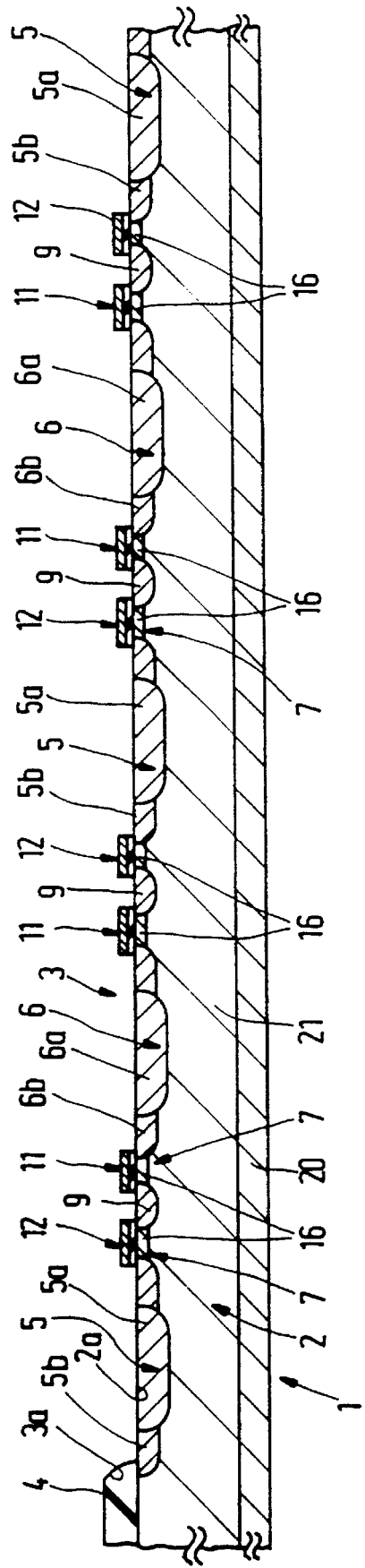
FIG. 5 is a cross-sectional view taken along the line V—V in FIG. 2.

The detailed construction of the device shown in FIGS. 1 to 5 will now be described with particular reference to FIGS. 3 to 5.

The semiconductor body 2 is formed by a relatively highly doped monocrystalline silicon substrate 20 onto which is epitaxially grown the relatively lightly doped body region 21. The lightly doped body region 21 has a low dopant concentration so as to provide an acceptable output capacitance. Typically the body region 21 is of p conductivity type and has a dopant concentration in the region of from about $0.7 \times 10^{15}$ to $1 \times 10^{15}$ atoms cm$^{-3}$.

A relatively highly doped channel stopping region 15 is provided beneath the field oxide 4 adjacent the ends 11a, 12"a of the insulated gate sections 11, 12. The field oxide 4 is formed by depositing or growing and then photolithographically defining a layer of insulating material such as silicon oxide. As shown, the relatively highly doped channel stopping region 15 extends slightly beyond the field oxide 4 into the active device area 3 so as to be spaced from the source and drain regions 5 and 6 by the lowly doped body region 16a.

Although not shown in the Figures, it may be useful, for ease of manufacture, for the channel stopping region 15 to extend completely around the periphery 3a of the active device area 3. Although this will mean that the channel stopping region 15 will form a pn junction with the source regions 5, 50 adjacent the ends 12'a leading from the additional sections 12b of the outer insulated gate 120, this should not present a problem in practice because during operation of the device there should be no potential difference across these pn junctions. Where, the channel stopping region 15 extends around the entire periphery 3a, then the field oxide 4 could be formed by local oxidation of silicon in known manner, although this would require a deep drive-in to obtain the overlap of the channel stopping region with the periphery 3a as shown in FIGS. 1 to 5.

A threshold adjustment region 16 is usually provided to enable a desired threshold voltage to be achieved. The threshold adjustment region 16 may be autoaligned to the field oxide 4 by using the field oxide 4 as a mask during the implantation process. In such a case, the lowly doped body region 16a will also include the threshold adjustment implant.

The insulated gate structure 10 is formed by a thin thermal gate oxide layer on top of which a gate conductive region is provided as a refractory metal silicide, in this example titanium silicide, although other suitable silicides, such as cobalt silicide, or doped polycrystalline silicon may be used. In this example the metal silicide is formed by first depositing a polycrystalline silicon layer. A layer of titanium is then provided over the polycrystalline silicon and the structure heated to cause silicidation. Generally, the heating is carried out in an inert, for example, an argon atmosphere, although other known silicidation processes may be used. The conductive gate layer is then patterned. The gate oxide layer may then be patterned to define the gate insulating regions 10a.

The patterning of the insulated gate structure 10 defines the first and second insulated gate sections 11 and 12 discussed above which have ends 11a, 12a extending up onto the field oxide 4 to provide connection areas 11c, 12c for connection to the gate conductors 13 and 14 to be formed subsequently.

Although relatively highly doped contact subsidiary regions 5a, 6a, 50a (see FIGS. 3 to 5) of the source, additional source and drain regions 5, 50 and 6 may be formed prior to the definition of the insulated gate structure 10, the main areas 5b, 50b and 6b and 6c of the source, additional source and drain regions 5, 50 and 6 are formed together with the island connection regions 9 using the insulated gate structure 10 and field oxide 4 as a mask so that the source, additional source, drain and island connection regions 5b, 50b and 6b are auto-aligned to the insulated gate structure 10 to reduce the gate to source/drain overlap and thus the parasitic resistance and parasitic gate to source/drain capacitance.

As mentioned above, part of the active device area 3 adjacent the ends 11a of the first insulated gate sections 11 is masked using a conventional mask such as a photosensitive resist (not shown) during the formation of the source, additional source, drain and island connection regions 5, 50, 6 and 9 so as to leave the lowly doped body region 16a at the area 21a of the body region 21 over which the ends 11a and 12"a of the insulated gate sections pass before extending up onto the field oxide so as to reduce the leakage currents from the ends 12'a remote from the additional insulated areas 12b.

Of course, as an alternative, the highly doped contact subsidiary regions 5a, 50a and 6a of the source and drain regions 5, 50 and 6 could be formed, using an appropriate mask, after the autoaligned implant for forming the source, additional source and drain areas 5b, 50b and 6b and the island connection regions 9.

An insulating layer 23 (FIG. 1) is then deposited and patterned to define contact holes to enable subsequent metallisation to make contact to the source and drain regions and the insulated gate sections 11 and 12. The metallization is provided by a highly doped conductor material such as aluminum or an aluminum alloy and is deposited and defined using conventional techniques to provide, as shown in FIG. 1, the first and second insulated gate conductors 13 and 14 making electrical contact with the ends 11a and 12'a, respectively, and the interdigitated source and drain electrodes 51 and 61 contacting the contact regions 5a and 50a of the source and additional source regions 5 and 50 and the contact regions 6a of the drain regions 6, respectively.

Figure 6:
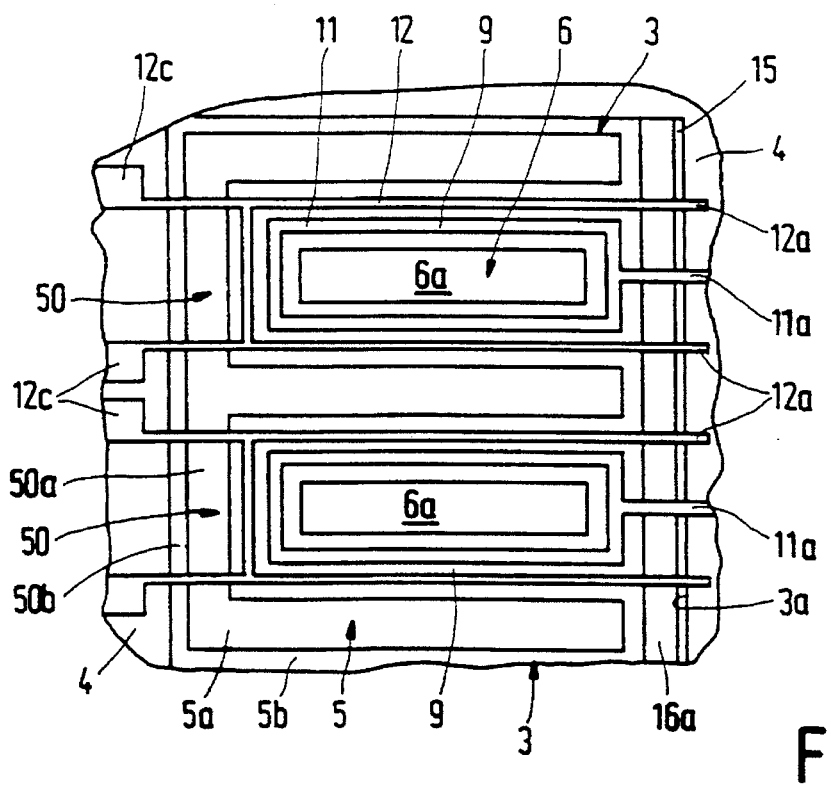
FIG. 6 is a schematic plan view, similar to FIG. 2, of a modified version of a semiconductor device in accordance with the invention.

FIG. 6 illustrates a modified version of the device shown in FIGS. 1 to 5 in which the field oxide periphery is modified and the additional source regions 50 connect with the source regions 5, by virtue of the highly doped contact regions 5a, 50a, formed before the insulated gate structure 10, to form a continuous comb-like source region. This should result in a lower access resistance, that is the resistance of the path to the conduction channel area, especially in the region of the corners in the insulated gate structure 10.

Although in the arrangements shown in FIGS. 1 to 6, the ends 12"a of the second insulated gate sections 12 remote from the additional source regions 50 are not connected, it may be possible to join the second insulated gate sections 12 together to form respective closed loops surrounding the closed loops formed by the first insulated gate sections 11 if the processing allows the use of two different levels of gate conductive material or otherwise allows (for example by a bridging section provided by the same metallization as the gate metallisation) a crossover between the first and second insulated gates 110 and 120.

It should of course be appreciated that the conductivity types given above could be reversed and that although the devices described above are normally off (enhancement mode) insulated gate field effect devices, normally on (depletion mode) devices could also be manufactured using the present invention. Also, the present invention may be applied to semiconductor materials other than silicon.

From reading the present disclosure, other variations and modifications will be apparent to persons skilled in the art.

Such variations and modifications may involve equivalents and other features which are already known in the semiconductor art and which may be used instead of or in addition to features already described herein.

We claim:

1. A semiconductor device comprising an insulated gate field effect device, the semiconductor device comprising a semiconductor body having adjacent one major surface an active device area bounded by an insulating region, the active device area comprising a plurality of source regions with adjacent source regions being separated by and spaced apart from an intervening associated drain region to define a respective conduction channel region between each source and drain region, the conductive channel region having a length which extends between the respective source and drain regions and having a width which is transverse to said length and in a plane parallel to said one major surface, the source and drain regions being aligned to form a row of regions, and an insulated gate structure overlying each conduction channel region for providing a gateable connection between each source and drain region, the insulated gate structure comprising, for each conduction channel region, a first insulated gate section adjacent the drain region and a second insulated gate section between the first insulated gate section and the adjacent source region, the insulated gate sections having ends extending beyond the active device area onto the insulating region to enable the first and second insulated gate sections to be connected to respective first and second insulated gate conductors outside of the active device area, the first insulated gate sections being configured within the active device area so as to laterally encircle each drain region by forming a respective closed loop insulated gate region laterally encircling each drain region and having a common end extending beyond the active device area onto the insulating region for enabling connection to the first insulated gate conductor, each drain region being located near an additional source region spaced apart from said plurality of source regions, provided within the active device area and spaced apart from the drain region in a direction which is parallel to said width of the conduction channel regions and perpendicular to said row of regions to define an additional conduction channel region between the drain region and the additional source region, and the second insulated gate sections being connected so as to provide an area of insulated gate between each additional source region and the associated drain region.

2. A device according to claim 1, wherein the insulated gate field effect device comprises an array of alternate source and drain regions provided within the active device area.

3. A device according to claim 1, wherein the active device area comprises a relatively lowly doped body region of one conductivity type within which opposite conductivity type source and drain regions are provided.

4. A device according to claim 1, wherein the source regions and additional source region near each drain region form a continuous source area.

5. A device according to claim 1, wherein adjacent first and second insulated gate sections are spaced apart and a conductive region is provided adjacent the one major surface in a space between the first and second insulated gate sections to enable a continuous conduction channel to be provided between each source and drain region.

6. A device according to claim 1, wherein the insulated gates have a conductive gate layer comprising a metal silicide.

7. A device according to claim 6, wherein the metal silicide is selected from the group consisting of titanium silicide and cobalt silicide.

8. A device according to claim 1, wherein the source and drain regions are self-aligned to the insulated gate structure.

* * * * *